(12) United States Patent
Nickerson et al.

(10) Patent No.: US 7,205,649 B2
(45) Date of Patent: Apr. 17, 2007

(54) BALL GRID ARRAY COPPER BALANCING

(75) Inventors: Robert Nickerson, Chandler, AZ (US); Hamid Ekhlassi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/610,317

(22) Filed: Jun. 30, 2003

(65) Prior Publication Data

US 2004/0262756 A1   Dec. 30, 2004

(51) Int. Cl.
- *H01L 23/053* (2006.01)
- *H01L 23/12* (2006.01)
- *H01L 23/06* (2006.01)
- *H01L 23/48* (2006.01)
- *H01L 23/52* (2006.01)

(52) U.S. Cl. .............. 257/700; 257/684; 257/690; 257/692; 257/737; 257/738; 257/758; 257/759; 257/760; 257/773; 257/774; 257/775; 257/780; 257/781

(58) Field of Classification Search ............... 257/698, 257/700, 735, 736, 737–738, 777–781, 773–774, 257/684, 690, 692, 758–760, 775; 174/260–262, 174/250, 255, 52.4; 439/66, 74, 91
See application file for complete search history.

(56) References Cited

U.S. PATENT DOCUMENTS

| | | | | |
|---|---|---|---|---|
| 5,459,287 A * | 10/1995 | Swamy | ...................... | 174/266 |
| 5,487,218 A * | 1/1996 | Bhatt et al. | ................... | 29/852 |
| 5,640,051 A * | 6/1997 | Tomura et al. | ............ | 257/778 |
| 5,884,397 A * | 3/1999 | Armezzani et al. | .......... | 29/840 |
| 5,906,042 A * | 5/1999 | Lan et al. | ..................... | 29/852 |
| 6,180,445 B1 * | 1/2001 | Tsai | ........................... | 438/238 |
| 6,316,828 B1 * | 11/2001 | Tao et al. | .................... | 257/723 |
| 6,323,436 B1 * | 11/2001 | Hedrick et al. | ............. | 174/256 |
| 6,350,705 B1 * | 2/2002 | Lin | ............................. | 438/779 |
| 6,365,975 B1 * | 4/2002 | DiStefano et al. | ......... | 257/777 |
| 6,400,576 B1 * | 6/2002 | Davidson | .................... | 361/763 |
| 6,469,370 B1 * | 10/2002 | Kawahara et al. | ......... | 257/678 |
| 6,497,943 B1 * | 12/2002 | Jimarez et al. | ............ | 428/209 |
| 6,521,845 B1 * | 2/2003 | Barrow | ....................... | 174/260 |
| 6,555,920 B2 * | 4/2003 | Chung et al. | ............... | 257/779 |
| 6,559,388 B1 * | 5/2003 | Kresge et al. | .............. | 174/252 |
| 6,586,846 B2 * | 7/2003 | Ho | .............................. | 257/784 |
| 6,586,864 B2 * | 7/2003 | Zhou et al. | ................. | 313/113 |
| 6,600,224 B1 * | 7/2003 | Farquhar et al. | ........... | 257/731 |
| 6,627,926 B2 * | 9/2003 | Hartswick et al. | ......... | 257/211 |

(Continued)

*Primary Examiner*—Ida M. Soward
(74) *Attorney, Agent, or Firm*—Schwegman, Lundberg, Woessner & Kluth, P.A.

(57) ABSTRACT

A ball grid array device includes a substrate having a first major surface and a second major surface. The first major surface includes leads for electrical connections. The second major surface is devoid of leads. The ball grid array device also includes a first land having a solder mask opening at the first major surface of the substrate, and a second, buried land near the first major surface of the substrate. A method for forming an electronic device includes forming an electronic circuit in a substrate, placing an input pad for an input to the electronic circuit on at least one major surface of the substrate, placing an output pad for an output from the electronic circuit on the at least one major surface of the substrate, and placing an electrically isolated pad near the at least one major surface of the substrate.

20 Claims, 6 Drawing Sheets

U.S. PATENT DOCUMENTS

| | | | |
|---|---|---|---|
| 6,717,255 B2* | 4/2004 | Oggioni et al. | 257/690 |
| 6,737,298 B2* | 5/2004 | Shim et al. | 438/108 |
| 6,790,710 B2* | 9/2004 | McLellan et al. | 438/122 |
| 6,864,565 B1* | 3/2005 | Hool et al. | 257/666 |
| 2001/0008309 A1* | 7/2001 | Iijima et al. | 257/737 |
| 2002/0007964 A1* | 1/2002 | Mori et al. | 174/260 |
| 2002/0013015 A1* | 1/2002 | Kado et al. | 438/107 |
| 2002/0045036 A1* | 4/2002 | Gorrell et al. | 428/209 |
| 2002/0185718 A1* | 12/2002 | Mikubo et al. | 257/678 |
| 2003/0173111 A1* | 9/2003 | Frutschy et al. | 174/260 |
| 2004/0041280 A1* | 3/2004 | Buchwalter et al. | 257/783 |
| 2004/0150962 A1* | 8/2004 | Heinemann et al. | 361/737 |
| 2004/0183212 A1* | 9/2004 | Alcoe | 257/786 |
| 2004/0238941 A1* | 12/2004 | Satoh et al. | 257/698 |

* cited by examiner

BALL GRID ARRAY COPPER BALANCING

FIELD OF THE INVENTION

The present invention is related to ball grid array packages. More specifically, the present invention relates to methods and apparatus for ball grid array copper balancing.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices has been the demand for increased numbers of external electrical connections to be present on the exterior of the die, and on the exterior of the semiconductor packages that receive the die for connecting the packaged device to external systems, such as a printed circuit board.

Ball grid array (BGA) packages are now used in many applications to provide the necessary number of external electrical connections on the die and on the exterior surface of the semiconductor packages. A BGA is a surface-mount chip package that uses a grid of solder balls for connectors. BGAs are available in both plastic and ceramic carriers. BGAs are noted for their compact size, high lead count and low inductance, that allows lower voltages to be used. BGA chips are easier to align to the printed circuit board, since the leads, which are called "solder balls" or "solder bumps," are farther apart than leaded packages. The bonding pads are also located on the side of the die nearest the transistors and other circuit devices formed in the die. As a result, the electrical path to the pad is shorter than the electrical path associated with other packaging techniques. Connection to the package is made when the chip is flipped over and soldered. As a result, the ball grid array packaged dies are commonly referred to as "flip chips" in the industry. Each bump connects to a corresponding package inner lead. In some instances, the packages are also referred to as "Area Grid Array" packages or Chip Size Packages (CSPs).

A typical BGA package is characterized by a large number of solder balls or bumps disposed in an array on a surface of the package. It is not uncommon to have hundreds of solder balls or bumps in an array. The BGA package is assembled to a matching array of conductive pads. The pads are connected to other devices within a substrate or circuitry on a circuit board. Heat is applied to reflow the leads (solder balls or bumps) on the package, thereby wetting the pads on the substrates and, once cooled, forming electrical connections between the package and the semiconductor device contained in the package and the substrate.

Certain designs, for example communication and wireless LDI (Low Density Interconnect) packages, often need less than the maximum number of leads (bumps or balls) available or allowed on a die. As a result, the die will have depopulated BGA lands. Areas of depopulated lands are generally referred to as voided areas. Leads (bumps or balls) corresponding to the depopulated area of the die are also not provided on the package. As a result, the package also has a void or voided areas. The package also has a lesser amount of copper than a package which mates with a die that uses all the leads (bumps or solder balls). The voids generally result in less copper on the exterior layers, as well as between layers and within layers of the package having less than the maximum number of leads (balls or bumps) for the BGA. In some designs, the depopulation includes a significant percentage of the array. The result of the depopulation of a significant percentage of the array is a copper balance mismatch within a layer or layers of the package, and a copper balance mismatch between layers of the package. Copper imbalance in a substrate design can result in failures of the die and package.

Other types of packages also may have depopulated areas and have copper imbalances as well. There are many other types of packages including pin grid arrays, bump grid arrays, dual in line packages (DIPs), quad flat packs, gull wing surface mount, and other packages for dies.

Currently, copper imbalances are corrected by adding a copper mesh covering a portion or the entire area of the package devoid of copper. These current solutions use a significant amount of the surface area and hinder the designer when routing actual electrical paths within a layer or between layers of the package or die.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention and such description is not intended to be construed as limiting in any manner.

DETAILED DESCRIPTION

Figure 1:
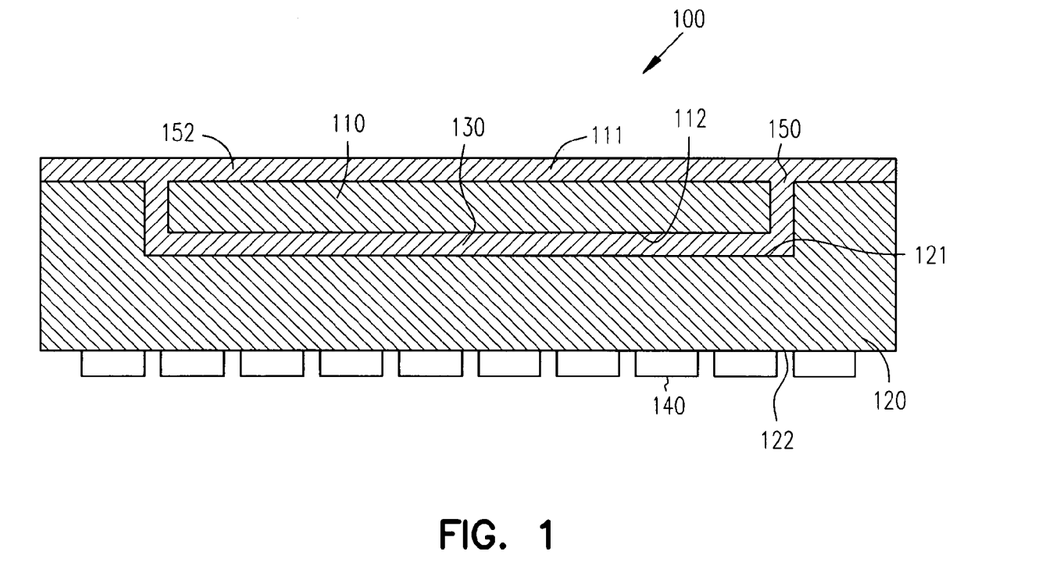
FIG. 1 illustrates a side view of an electronic package that includes a carrier and a die that incorporates an embodiment of this invention.

FIG. 1 is a side view of an electronic package 100. The electronic package 100 includes a first substrate 110 and a second substrate 120. As shown, the first substrate 110 corresponds to a die that is cut from a wafer and carries the electrical circuitry for the electronic package 100. The first substrate 110 has a first major surface 111 and a second major surface 112. The second substrate 120 has a first major surface 121 and a second major surface 122. The second substrate 120, as shown in FIG. 1, is a carrier that is used to form the electronic package 100. The carrier 120 carries or includes the die (the first substrate 110). The first substrate 110 is joined or connected to the second substrate 120 by way of leads 130. The leads 130 are in the form of bumps or balls of solder. The leads 130 are typically formed in an array with a very specific spacing or pitch. The array of leads or solder balls 130 are positioned at the second major surface 112 of the first substrate 110. The array associated with leads 130 of the first substrate 110 are matched to connection points on the second substrate 120.

When the leads are in the form of bumps or solder balls, the electronic device and the leads 130 in an array are termed a ball grid array (BGA) device. The carrier 120 also has an array of bumps or solder balls 140 positioned at the second major surface 122 of the second substrate 120 and also may be termed a ball grid array device. It should be noted that the first major surface 111 of the first substrate 110 is devoid of leads (bumps or balls) and that the first major surface 121 of the second substrate 120 is also devoid of leads (bumps or balls). Also noteworthy is that the die could alternately be described as a second substrate and the carrier could be alternately described as the first substrate. In other words, the designation of first or second substrate could be interchanged. After connecting or joining the first substrate 110 to the second substrate 120, a plastic substance 150 is injected in the spaces between the first substrate 110 and the second substrate 120. In addition, plastic 152 is placed over the first substrate 110 and the second substrate 120. The plastic 150, 152 encapsulates the first substrate 110 and the second substrate 120. By encapsulating the first substrate 110 and the second substrate 120, the parts do not become dirty or oxidize, and the movement of the first substrate 110 with respect to the second substrate 120 is minimized.

Figure 2:
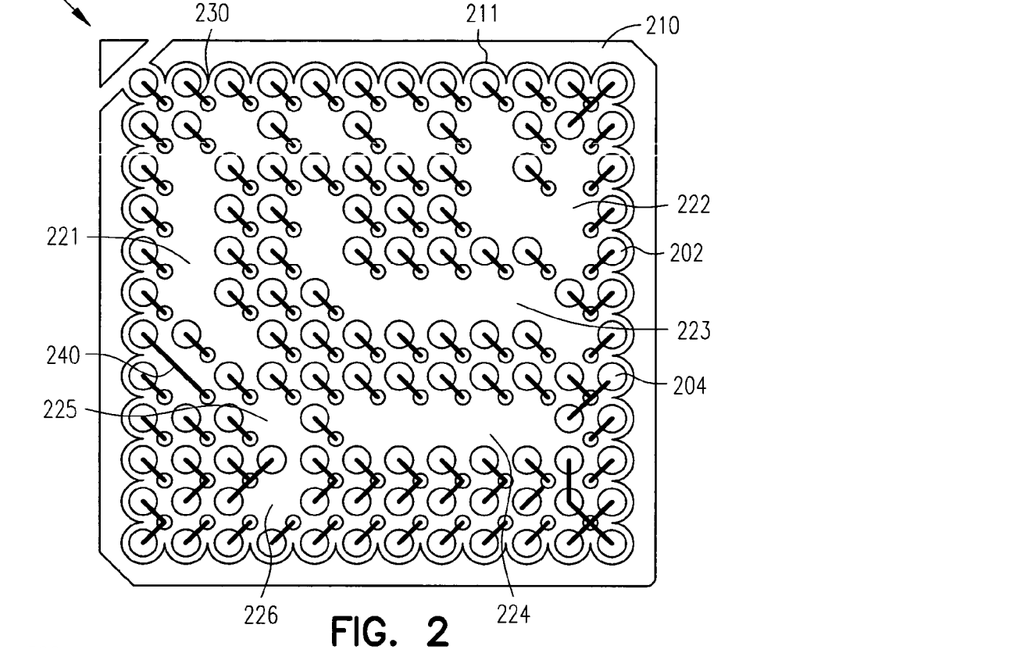
FIG. 2 illustrates a bottom view of an electronic package that includes a portion of an array of input pads and output pads, according to an embodiment of the invention.

FIG. 2 illustrates a bottom view of an electronics package 200 that includes a portion of an array of various input pads 202 and output pads 204. FIG. 2 also shows representations of vias 230. When a particular input pad or output pad is connected by a metallization layer, the metallization layer is shown as a line between the two pads or lands as shown by reference 240. The electronic package is a substrate 210 that includes a major surface 211. The major surface will have leads which are in the form of bumps or solder balls attached to the pads or lands 202, 204. As shown in FIG. 2, the major surface 211 is not fully populated with the various input pads 202 and output pads 204. As a consequence, the major surface 211 includes portions that have closely spaced lands or input pads 202 and output pads 204, and also has voided areas where there is no land or input pad 202 or output pad 204. The voided areas include area 221, area 222, area 223, area 224, area 225 and voided area 226. The maximum number of possible input pads and output pads for the array shown in FIG. 2 is 144. As shown in FIG. 2, there are 12 positions for input pads 202 and output pads 204 or lands in a first direction, and 12 possible positions for input pads 202 and output pads 204 in a second direction. In other words, there is a possibility of having 144 leads or input pads 202 and output pads 204 for this particular substrate 210. The voided areas 221, 222, 223, 224, 225, 226 occur because the electronics associated with the package use less than 144 input pads and output pads. In other words, the electronics associated with a package are fully functional without needing all 144 possible input pads 202 and output pads 204 in combination. Consequently, a number of the input pads 202 and output pads 204 are eliminated, thereby producing the voided areas 221, 222, 223, 224, 225, 226. In the past these voided areas were not provided with any contacts, lands or input pads or output pads since, simply, they were not needed. The inventors determined that in some instances a high failure rate occurred in substrates 210 since there was a difference in the co-efficient of thermal expansion (CTE) between the voided areas 221, 222, 223, 224, 225, 226 and those areas that included lands corresponding to input pads 202 and output pads 204.

Figure 3:
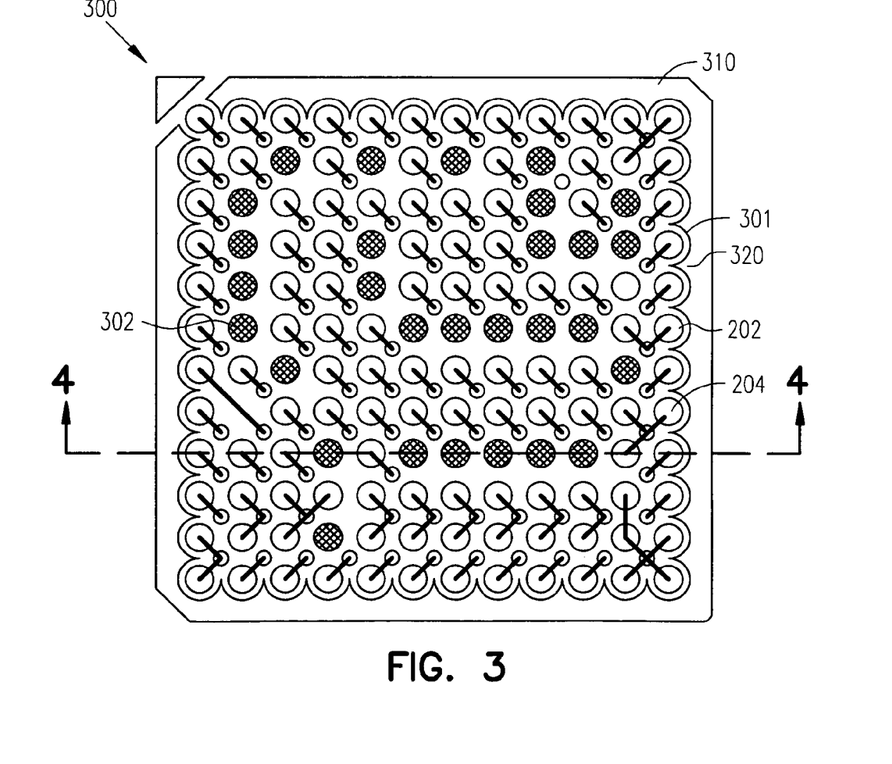
FIG. 3 illustrates a bottom view of an electronic package that includes a completed array, including input pads, output pads, and electrically isolated pads, according to an embodiment of this invention.

FIG. 3 illustrates a bottom view of an electronic package 300 that includes a completed array 301 of input pads 202, output pads 204 and electrically isolated pads or lands 302. The isolated pads or lands 302 populate the previously voided areas 221, 222, 223, 224, 225, 226 (shown in FIG. 2). The electrically isolated pads or lands 302 are insulated. There is no solder mask opening associated with the electrically isolated lands or pads 302, and the lands or pads 302, depicted as solid gray circles, do not attach to other lands. In other words, the electrically isolated lands or pads 302 do not attach to a net. Furthermore, since there is no solder mask opening associated with any of the electrically isolated lands or pads 302, the electrically isolated lands or pads 302 are said to be buried in the substrate 310 of the electronic package 300.

Figure 4:
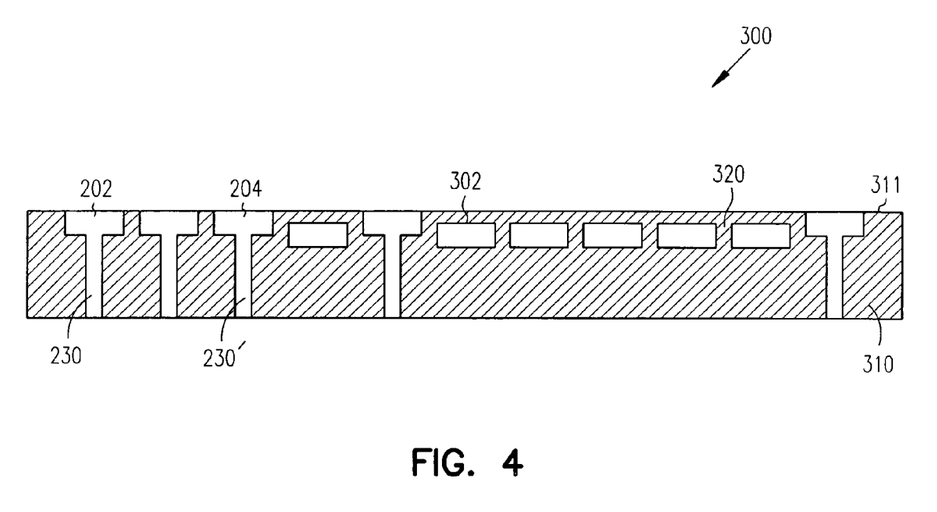
FIG. 4 illustrates a cross-sectional view of an electrically isolated pad along line 4—4 in FIG. 3, according to an embodiment of the invention.

FIG. 4 illustrates a cross-sectional view along line 4—4 of FIG. 3 showing input pads 202, output pads 204 and electrically isolated pads or lands 302. The input pad 202 includes a via 230 while the output pad 204 includes a via 230'. The input pads and output pads 202, 204 are exposed upon a major surface 311 of the substrate 310. The major surface 311 corresponds to the ball side of a BGA device. As shown in FIG. 4, the lands or pads associated with the input pads 202 and the output pads 204 have not been provided with leads, such as balls or bumps, at the major surface 311 of the substrate 310. The electrically isolated pads or lands 302 are positioned near the major surface 311 but are covered and therefore electrically isolated or insulated. It should be noted that there are no vias and no connections to a net associated with the substrate 310. Therefore, each of the electrically isolated pads or vias are disks of electrically conductive material which are made of the same material as the pads or lands associated with the input pads 202 and the output pads 204 of the electrical device 310. Thus, the electrically isolated pads 302 occupy the positions in the array which were previously left void, filling those positions with conductive material near the major surface 311 associated with the balls or bumps of the BGA. The electrically isolated pads or lands 302 provide for a more homogeneous and regular pattern of materials at or near the surface 311 of the substrate 310. The more regular and homogeneous configuration of materials at or near the surface 311 of the substrate 310 provides for a more uniform coefficient of thermal expansion or net coefficient of thermal expansion from the interaction of the conductive material forming the input pads 202, the output pads 204, and the electrically isolated pads 302, and the material 320 surrounding the pad 302. The material 320 surrounding the pads, including pad 302, can be any of a variety of materials, including ceramic or plastic. Put in another way, the lands associated with input pads 202, output pads 204, and electrically isolated lands 302 within the matrix of the material 320 are made uniform or made more uniform by the addition of the electrically isolated lands 302, thereby making the coefficient of thermal expansion associated with the combination of the lands 202, 204, 302 and the material surrounding the lands 320 more uniform across the volume of the substrate near the major surface 311.

Figure 5:
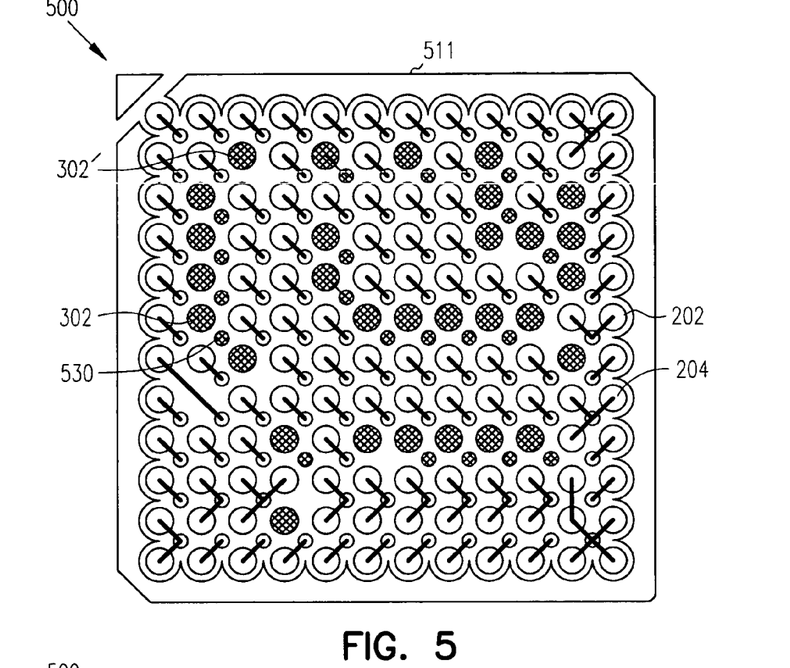
FIG. 5 illustrates a bottom view of an electronic package that includes a portion of an array of various input pads, output pads, isolated pads and attached vias, according to an embodiment of the invention.
Figure 6:
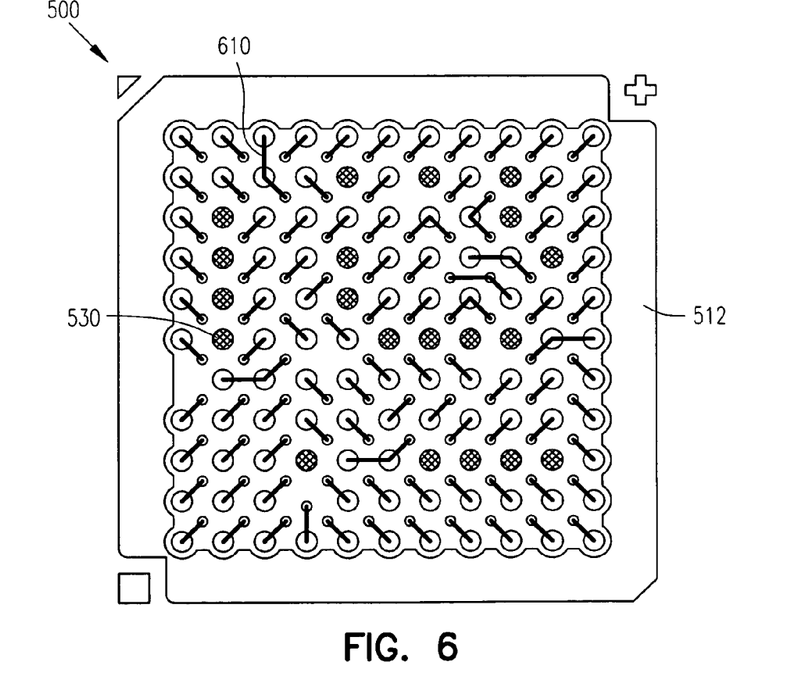
FIG. 6 illustrates a top view of an electronic package that includes a portion of an array of various input pads, output pads, and attached vias, according to an embodiment of the invention.

FIG. 5 illustrates a bottom view of an electronic package 500 that includes a portion of an array of various input pads 202, output pads 204, isolated pads 302 and attached vias 530. FIG. 6 illustrates a top view of an electronics package 500 that includes a portion of an array of various input pads 202, output pads 204, isolated pads 302 and vias 530. Now referring to FIGS. 5 and 6, another embodiment of the invention will be discussed. In this particular embodiment of the invention, the voided areas 221, 222, 223, 224, 225, 226 (as shown in FIG. 2) are filled with isolated pads 302. In some instances, the isolated pads 302 also include a via 530 attached to or positioned near the isolated pad 302. Shown in FIG. 5, the isolated pad appears as a gray solid circle, while the via 530 is illustrated as a smaller solid gray circle, which intersects the solid gray circle representing the electrically isolated pad. Thus, the voided areas 221, 222, 223, 224, 225, 226 are filled with either an electrically isolated pad 302 by itself, or an electrically isolated pad in combination with a via positioned near or attached to the electrically isolated pad 302. It should be noted that if the via 530 is connected to the electrically isolated pad 302, the combination of the via 530 and electrically isolated pad 302 is also electrically isolated. The combination via 530 and electrically isolated pad 302 is not connected to the electronics associated with the package 500, and furthermore there is no solder mask opening on a major surface 511 associated with the ball side or bump side or lead side of the ball grid array.

FIG. 6 shows a view of the electronic package from the top or from the second major surface 512. With this particular view, the top surface of surface 512 has been removed so that the tops of the electrically isolated vias 530 are visible. As can be seen from FIG. 6, the electrically isolated vias 530 are shown as small gray solid circles. It should be noted that there are areas of metallization which are used to connect an input pad and an output pad. The areas of metallization are represented by the reference numeral 610. An electrically isolated pad or land 302' is not provided with an electrically isolated via, since doing so would produce a via that would connect with the metallization layer 610 near the major surface 512 of the electrical device. The voided areas 221, 222, 223, 224, 225, 226 are essentially filled with electrically isolated lands 302, 302'. Where there is not a possibility of a via connecting to the electronics or net associated with the substrate 500, a via 530 as provider is positioned near or attached to the electrically isolated land 302.

Figure 7:
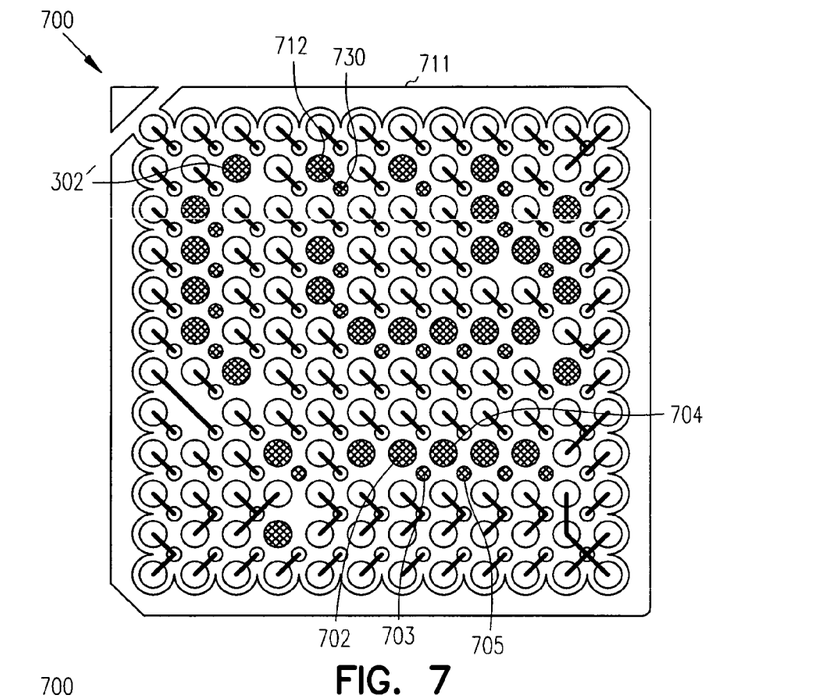
FIG. 7 is a top view of an electronic package that includes a completed array, including input pads, output pads, a metallization layer, and electrically isolated pads, metallization layer and attached vias, according to an embodiment of this invention.
Figure 8:
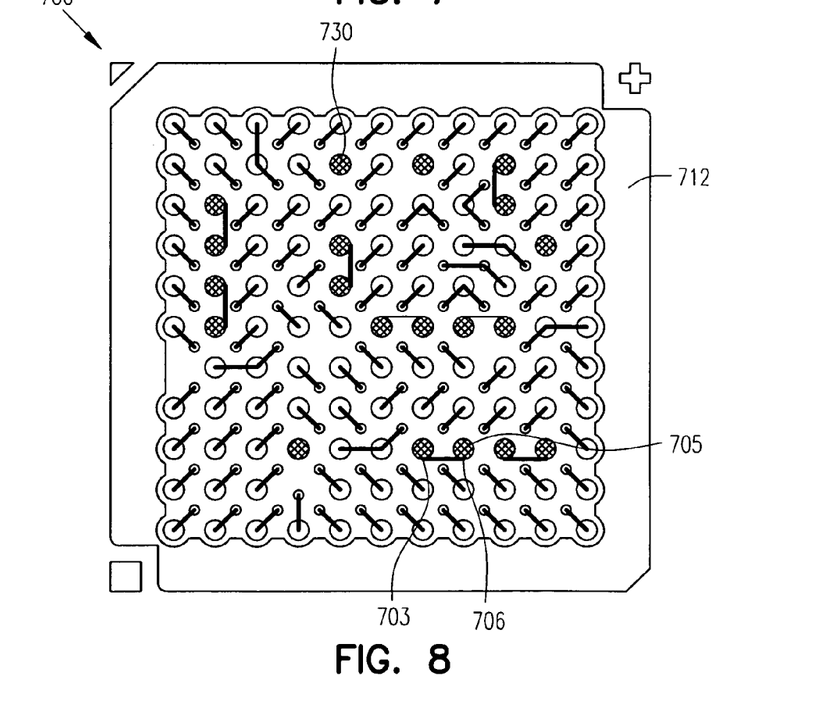
FIG. 8 illustrates a bottom view of an electronic package that includes a completed array, including input pads, output pads, a metallization layer, and electrically isolated pads, metallization layer and attached vias, according to an embodiment of this invention.

FIGS. 7 and 8 are top and bottom views, respectively, of an electronic package 700 that includes a completed array. The completed array includes a first isolated pad 702, a second isolated pad 704, a via 703 associated with the first isolated pad and a second via 705 associated with the second isolated pad or land 704. The isolated pads 702, 704 and the isolated vias 703, 705 are viewable from the first major surface 711 shown in FIG. 7. A metallization layer 706 which connects the first via 703 and the second via 705 is also provided in the substrate 700 near a second surface 712 of the substrate 700. The metallization layer 706, as well as the vias 703, 705, can be seen in FIG. 8. It should be noted that the first isolated pad 702, the vias 703, the second isolated pad 704, the second vias 705, and the metallization layer 706 are electrically isolated. In other words, the connected lands 702, 704 are electrically isolated and the various portions of the structure 702, 703, 704, 705 and 706 are not connected to a net associated with the package or the electrical device 700. The first land 702 and the second land 704 are also slightly below the first major surface 711, and no solder mask is provided.

Thus it can be seen that the embodiment shown in FIGS. 7 and 8 includes isolated pads 302' which fill the void without any additional structure, isolated pads 702 with a via 730 positioned near or attached to the isolated pad 702, or the structure for connecting two electrically isolated pads 702, 704 discussed above. In other words, FIGS. 7 and 8 include three separate types of structures which are used to fill the voids 221, 222, 223, 224, 225, 226 (see FIG. 2). Each of the three different types of structures is electrically isolated and does not affect the electrical characteristics of the electrical device 700 having the substrate. The structures added to the voided areas provide for a more homogeneous combination of electrically conductive material associated with the 12×12 array and associated with the substrate 700. The more homogeneous or uniform the material or the combination of the conductive material and the material such as plastic or ceramic surrounding the electrically conductive material, the more the previously voided areas are thermally matched to the previously populated areas or the areas populated with vias and conductive paths used to conduct signals and power for the electrical or electronic circuitry associated with the substrate.

Figure 9:
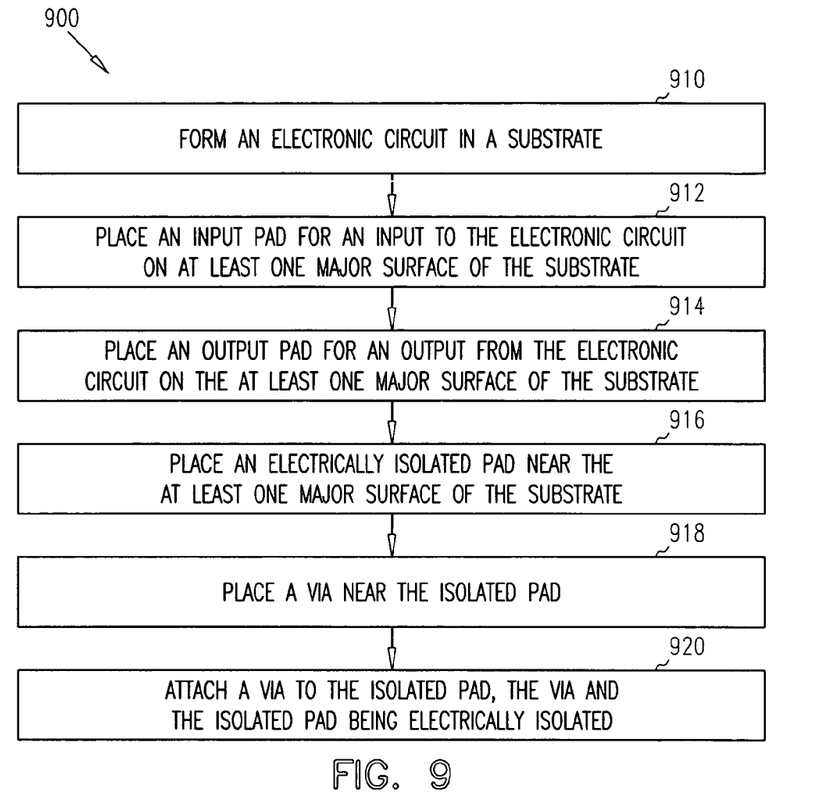
FIG. 9 is a flow diagram of a method for forming an electronic device according to an embodiment of this invention.

FIG. 9 is a flow diagram of a method for forming an electronic device 900 according to an embodiment of this invention. The method for forming an electronic device 900 includes forming an electronic circuit in a substrate 910, placing an input pad for an input to the electronic circuit on at least one major surface of the substrate 912, placing an output pad for an output from the electronic circuit on the at least one major surface of the substrate 914, and placing an electrically isolated pad near the at least one major surface of the substrate 916. The input pad, the output pad and the isolated pad are positioned in a pattern. In some embodiments, a via is placed near or attached to the isolated pad 918. The isolated pad and the via are electrically isolated 920.

Figure 10:
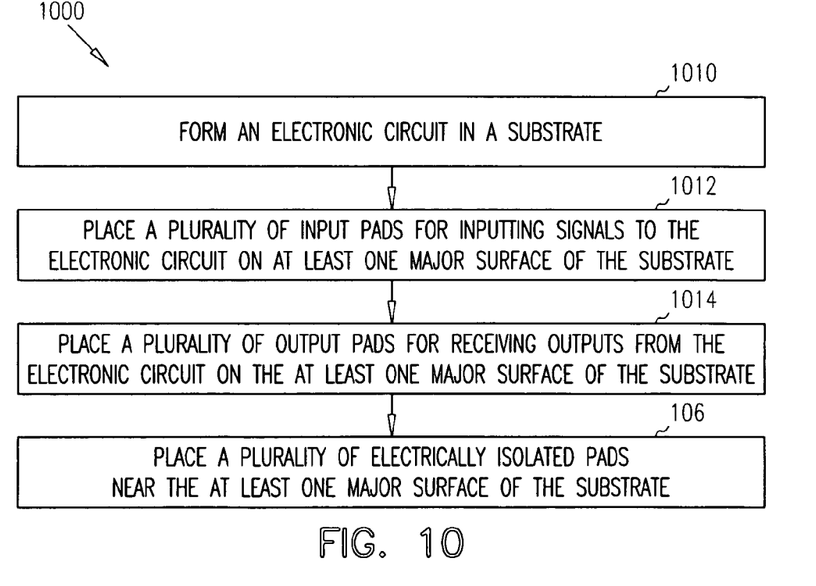
FIG. 10 is a flow diagram of a method for forming an electronic device according to another embodiment of this invention.

FIG. 10 is a flow diagram of a method for forming an electronic device 1000 according to another embodiment of this invention. The method for forming an electronic device 1000 includes forming an electronic circuit in a substrate 1010, placing a plurality of input pads for inputting signals to the electronic circuit on at least one major surface of the substrate 1012, and placing a plurality of output pads for receiving outputs from the electronic circuit on the at least one major surface of the substrate 1014. The method 1000 also includes placing a plurality of electrically isolated pads near the at least one major surface of the substrate 1016. The plurality of input pads, the plurality of output pads, and the plurality of electrically isolated pads form an array. The plurality of input pads and the plurality of output pads form an array having at least one void therein (shown in FIG. 2).

The plurality of electrically isolated pads are placed to complete the array. The plurality of input pads, the plurality of output pads, and the plurality of electrically isolated pads form an array of equally spaced metal portions in a matrix of a second material.

A ball grid array device includes a substrate having a first major surface and a second major surface. The first major surface includes leads for electrical connections. The second major surface is devoid of leads. The ball grid array device also includes a first land having a solder mask opening at the first major surface of the substrate, and a second, buried land near the first major surface of the substrate. The ball grid array device also includes an electrical path attached to the first land. The first land and the connected electrical path pass a signal to another device. The second, buried land near the first major surface of the substrate is electrically isolated. The ball grid array device includes a via positioned near the second, buried land. The second, buried land and the via are electrically isolated. In some embodiments, the via is connected to the second, buried land. The second, buried land and the connected via are electrically isolated. The ball grid array device further includes a via positioned near the second, buried land, and a metallization layer proximate the second major surface of the ball grid array device. The second, buried land, the via, and the metallization layer proximate the second major surface of the ball grid array device are electrically isolated. In some embodiments, the second, buried land, the via, and the metallization layer proximate the second major surface of the ball grid array device are electrically connected to one another. In some embodiments, the ball grid array device further includes a first via positioned near the second, buried land, and a third, buried land. A second via is positioned near the third, buried land, and a metallization layer is proximate the second major surface of the ball grid array device. The second via and the third via are proximate the metallization layer. The second, buried land, the first via, the third buried, land, the second via, and the metallization layer proximate the second major surface of the ball grid array device are electrically isolated. In some embodiments, the second, buried land, the first via, the third buried, land, the second via and the metallization layer proximate the second major surface of the ball grid array device are connected.

An electronic package includes a die that further includes a first substrate having a lead surface including an array of leads and an area devoid of leads. The electronic package also includes a carrier that further includes a second substrate. The second substrate includes an array of leads and an area devoid of leads that corresponds to the surface of the first substrate. At least one of the first substrate or the second substrate further include a first land attached to an electrical circuit within the at least one of the first substrate or the second substrate, and a second electrically isolated land within the at least one of the first substrate or the second substrate. The second, electrically isolated land is positioned near the lead surface of the first substrate or the second substrate. The electronic package also includes an electrically isolated via positioned near the electrically isolated land. The electronic package also includes a via connected to the second land. The via and the second land are electrically isolated. The electronic package also includes a metallization layer distal from the surface, and a via. The via is connected to the second land and the metallization layer. The via, the metallization layer, and the second land are electrically isolated. The die is connected to the carrier. The package further includes an injected material positioned between the first substrate and the second substrate. The injected material also covers the die. In some embodiments, one of the first substrate and the second substrate includes a plastic material. In other embodiments, one of the first substrate and the second substrate includes a ceramic material.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A ball grid array device comprising:
   a substrate further comprising:
      a first major surface including leads for electrical connections;
      a second major surface devoid of leads;
      a first land having a solder mask opening at the first major surface of the substrate; and
      a second, buried land near the first major surface of the substrate, wherein the substrate further includes a plurality of first lands and a plurality of second lands formed in an array of equally spaced metal portions in a matrix of a second material, wherein the second lands are electrically isolated.

2. The ball grid array device of claim 1 wherein the ball grid array device further includes an electrical path attached to the first land, wherein the first land and the connected electrical path pass a signal to another device.

3. The ball grid array device of claim 1 wherein the first land and the second, buried land are unconnected electrically.

4. The ball grid array device of claim 1 wherein the second, buried land near the first major surface of the substrate is electrically insulated.

5. The ball grid array device of claim 1 wherein the substrate further includes a plurality of first lands and a plurality of second lands formed in an array.

6. The ball grid array device of claim 1 further including a via connected to the second, buried land, wherein the second, buried land and the via are substantially surrounded by the insulative material and substantially electrically insulated.

7. The ball grid array device of claim 1 further including a via positioned near the second, buried land, and a metallization layer proximate the second major surface of the ball grid array device, wherein the second, buried land, the via, and the metallization layer proximate the second major surface of the ball grid array device are substantially electrically insulated.

8. The ball grid array device of claim 7 wherein the second, buried land, the via, and the metallization layer proximate the second major surface of the ball grid array device are electrically connected to one another and substantially surrounded by electrically insulative material.

9. The ball grid array device of claim 1 further comprising:
   a first via positioned near the second, buried land;
   a third, buried land;

a second via positioned near the third, buried land; and a metallization layer proximate the second major surface of the ball grid array device, the second via and a third via proximate the metallization layer, wherein the second, buried land, the first via, the third buried, land, the second via and the metallization layer proximate the second major surface of the ball grid array device are substantially surrounded by insulative material and electrically insulated.

10. The ball grid array device of claim 9 wherein the second, buried land, the first via, the third buried, land, the second via and the metallization layer proximate the second major surface of the ball grid array device are electrically connected.

11. The ball grid array device of claim 1 further comprising a carrier for the substrate.

12. The ball grid array device of claim 11 wherein the carrier includes a set of lands corresponding to the leads for electrical connection of the first major surface of the substrate.

13. The ball grid array device of claim 12 wherein the carrier includes a set of lands that are electrically isolated from the lands corresponding to the leads.

14. The ball grid array device of claim 12 wherein the carrier includes a set of vias corresponding to the set of lands corresponding to the leads for electrical connection of the first major surface of the substrate.

15. The ball grid array device of claim 11 wherein the carrier includes a set of lands corresponding to the leads for electrical connection of the first major surface of the substrate, the leads including a set of balls associated with one of the substrate or the carrier.

16. The ball grid array device of claim 11 wherein the substrate is connected to the carrier to form a package further comprising an injected material positioned between the first major surface and the second major surface.

17. The ball grid array device of claim 16 wherein the injected material covers the substrate.

18. The ball grid array device of claim 11 wherein one of the substrate and the carrier includes a plastic material.

19. The ball grid array device of claim 11 wherein one of the substrate and the carrier includes a ceramic material.

20. The ball grid array device of claim 11 wherein the carrier includes an opening therein sized to receive the substrate.

* * * * *